United States Patent
Huang et al.

(10) Patent No.: US 11,742,335 B2
(45) Date of Patent: Aug. 29, 2023

(54) ELECTRONIC DEVICE

(71) Applicant: InnoLux Corporation, Miao-Li County (TW)

(72) Inventors: Shih-Chang Huang, Miao-Li County (TW); Chia-Lun Chen, Miao-Li County (TW); Ming-Hui Chu, Miao-Li County (TW); Chin-Lung Ting, Miao-Li County (TW); Chien-Tzu Chu, Miao-Li County (TW); Hui-Chi Wang, Miao-Li County (TW)

(73) Assignee: INNOLUX CORPORATION, Miao-Li County (TW)

( * ) Notice: Subject to any disclaimer, the term of this patent is extended or adjusted under 35 U.S.C. 154(b) by 114 days.

(21) Appl. No.: 17/120,643

(22) Filed: Dec. 14, 2020

(65) Prior Publication Data

US 2021/0210470 A1 Jul. 8, 2021

(30) Foreign Application Priority Data

Jan. 6, 2020 (CN) .......................... 202010010108.4

(51) Int. Cl.
| | |
|---|---|
| *H01L 25/075* | (2006.01) |
| *H01L 27/12* | (2006.01) |
| *H01L 33/50* | (2010.01) |
| *H01L 33/56* | (2010.01) |
| *H01L 33/60* | (2010.01) |
| *H01L 33/62* | (2010.01) |
| *H01L 25/16* | (2023.01) |
| *H01L 33/54* | (2010.01) |

(52) U.S. Cl.
CPC ...... *H01L 25/0753* (2013.01); *H01L 27/1214* (2013.01); *H01L 33/50* (2013.01); *H01L 33/54* (2013.01); *H01L 33/56* (2013.01); *H01L 33/60* (2013.01); *H01L 33/62* (2013.01)

(58) Field of Classification Search
CPC ......... H01L 33/60; H01L 33/54; H01L 33/56; H01L 25/0753; H01L 27/1214
See application file for complete search history.

(56) References Cited

U.S. PATENT DOCUMENTS

| | | | |
|---|---|---|---|
| 10,193,042 B1 * | 1/2019 | Tsai | ...... H01L 33/505 |
| 2002/0011601 A1 * | 1/2002 | Furukawa | ...... H01L 24/97 |
| | | | 257/E33.059 |
| 2012/0112220 A1 * | 5/2012 | West | ...... H01L 33/62 |
| | | | 257/E33.072 |

(Continued)

FOREIGN PATENT DOCUMENTS

| | | | | | |
|---|---|---|---|---|---|
| CN | 109557721 A | * | 4/2019 | ....... | G02F 1/133603 |
| JP | 2005024924 A | * | 1/2005 | | |

(Continued)

*Primary Examiner* — Younes Boulghassoul
*Assistant Examiner* — Antonio B Crite
(74) *Attorney, Agent, or Firm* — McClure, Qualey & Rodack, LLP

(57) ABSTRACT

An electronic device is provided. The electronic device includes a driving substrate, a plurality of light-emitting units, and a protective layer. The light-emitting units are electrically connected to the driving substrate. The protective layer covers the light-emitting units, and the protective layer has a Young's modulus less than or equal to 20 MPa.

14 Claims, 7 Drawing Sheets

(56) References Cited

U.S. PATENT DOCUMENTS

| | | | |
|---|---|---|---|
| 2016/0190105 A1* | 6/2016 | Rhee | H05B 33/145 |
| | | | 257/76 |
| 2016/0233453 A1* | 8/2016 | Lee | H01L 51/0097 |
| 2017/0263828 A1 | 9/2017 | Mao et al. | |
| 2018/0190871 A1 | 7/2018 | Kim et al. | |
| 2019/0027659 A1* | 1/2019 | Yamada | H01L 33/58 |
| 2019/0035986 A1* | 1/2019 | Maeda | H01L 33/54 |
| 2019/0198735 A1* | 6/2019 | Tsai | H01L 33/06 |

FOREIGN PATENT DOCUMENTS

| | | | | |
|---|---|---|---|---|
| WO | WO-2013118076 A1 * | 8/2013 | | H01L 25/0753 |
| WO | WO-2019223977 A1 * | 11/2019 | | H01L 25/0753 |

\* cited by examiner

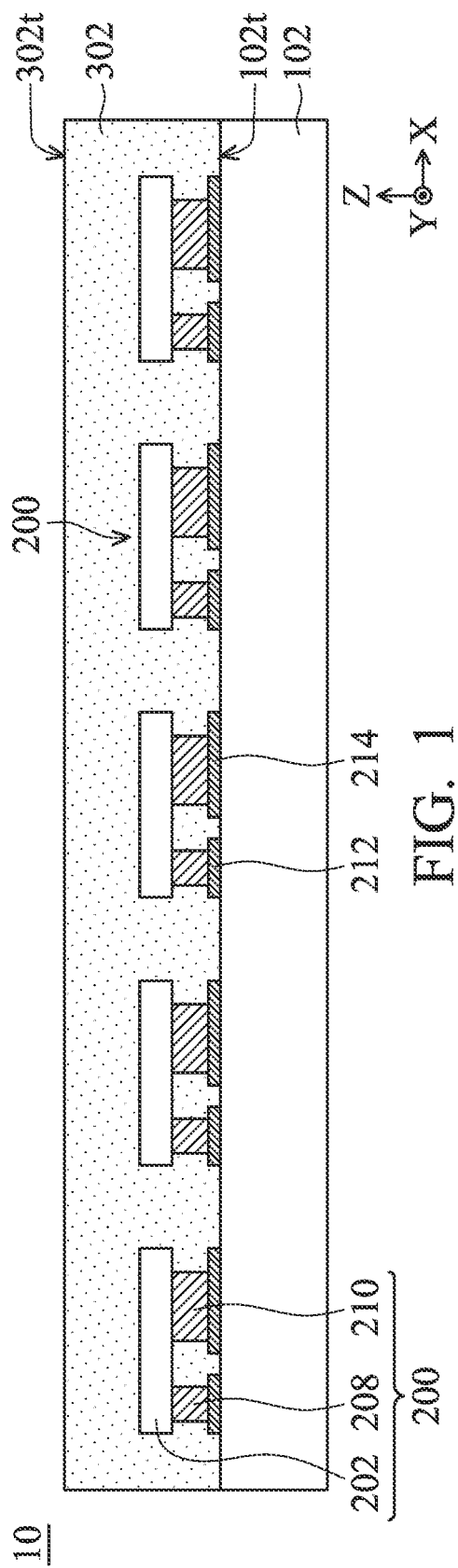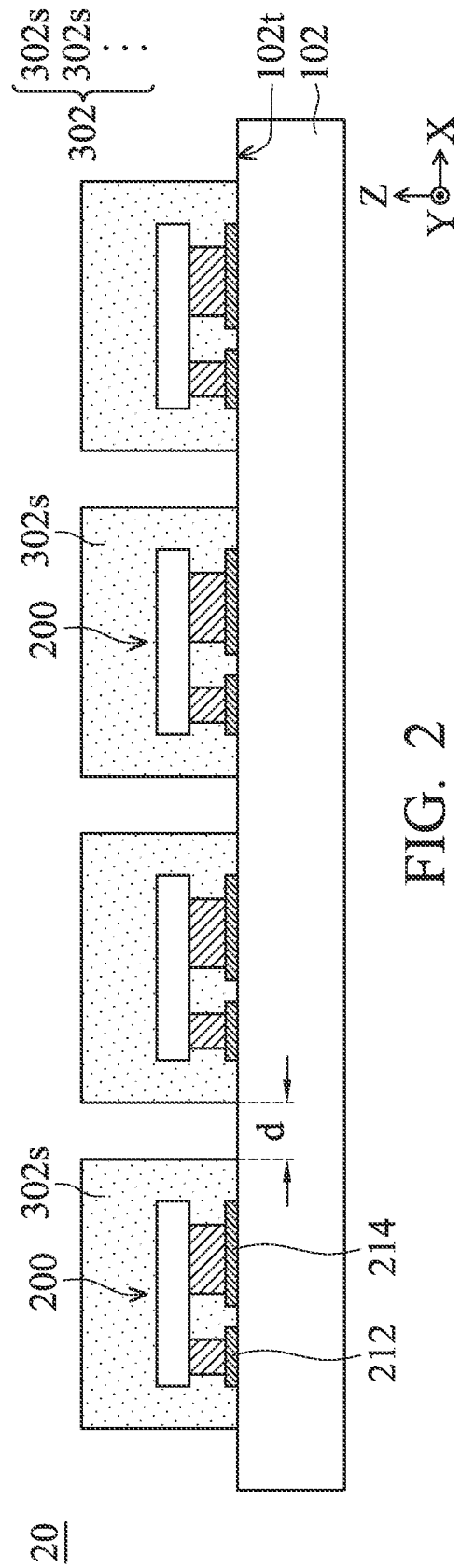

ELECTRONIC DEVICE

CROSS REFERENCE TO RELATED APPLICATIONS

This application claims priority of China Patent Application No. 202010010108.4, filed on Jan. 6, 2020, the entirety of which is incorporated by reference herein.

BACKGROUND

Technical Field

The present disclosure relates to an electronic device, and in particular relates to an electronic device that includes a protective layer with a specific Young's modulus.

Description of the Related Art

Electronic devices with display panels, such as smartphones, tablet computers, notebook computers, displays and TVs, have become indispensable necessities in modern life. With the flourishing development of these electronic devices, consumers have high expectations regarding their quality, functionality, or price.

Although existing electronic devices with display panels have been substantially adequate for their intended purposes, they have not been satisfactory in all respects. Therefore, the development of structural designs that may improve the quality or performance of such electronic devices is still one of the research topics in the current industry.

SUMMARY

In accordance with some embodiments of the present disclosure, an electronic device is provided. The electronic device includes a driving substrate, a plurality of light-emitting units, and a protective layer. The light-emitting units are electrically connected to the driving substrate. The protective layer covers the light-emitting units, and the protective layer has a Young's modulus less than or equal to 20 MPa.

A detailed description is given in the following embodiments with reference to the accompanying drawings.

BRIEF DESCRIPTION OF THE DRAWINGS

The disclosure may be more fully understood by reading the subsequent detailed description and examples with references made to the accompanying drawings, wherein:

FIG. 1 and FIG. 2 are cross-sectional diagrams of an electronic device in accordance with some embodiments of the present disclosure;

DETAILED DESCRIPTION

Figure 3:
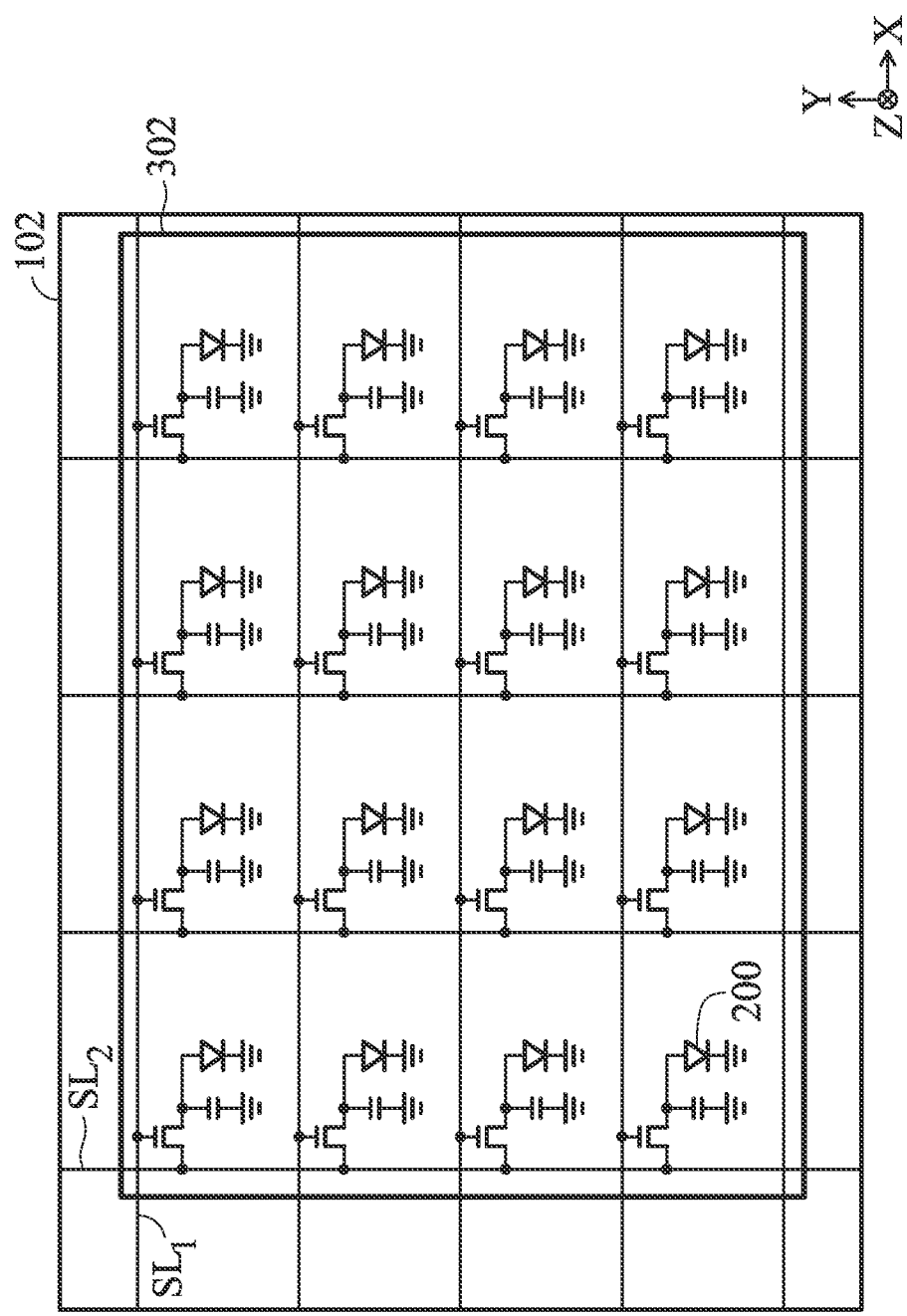
FIG. 3 and FIG. 4 are top-view diagrams of an electronic device in accordance with some embodiments of the present disclosure.

The electronic device of the present disclosure is described in detail in the following description. It should be understood that in the following detailed description, for purposes of explanation, numerous specific details and embodiments are set forth in order to provide a thorough understanding of the present disclosure. The specific elements and configurations described in the following detailed description are set forth in order to clearly describe the present disclosure. It will be apparent that the exemplary embodiments set forth herein are used merely for the purpose of illustration and the present disclosure is not limited thereto. In addition, the drawings of different embodiments may use like and/or corresponding numerals to denote like and/or corresponding elements in order to clearly describe the present disclosure. However, the use of like and/or corresponding numerals in the drawings of different embodiments does not suggest any correlation between different embodiments.

It should be understood that some of the elements or devices in the drawings may exist in various forms well known to those skilled in the art. In addition, relative terms such as "lower" or "bottom" or "higher" or "top" may be used in the embodiments to describe the position of one element relative to another. It should be appreciated that if a device is flipped upside down, an element that is "lower" will become an element that is "higher". The descriptions of the exemplary embodiments are intended to be read in connection with the accompanying drawings, which are to be considered part of the entire written description. It should be understood that the drawings are not drawn to scale. In fact, the size of the element may be arbitrarily enlarged or reduced in order to clearly express the features of the present disclosure.

In addition, when it is described that a first material layer is located on or over a second material layer, it includes the case where the first material layer is in direct contact with the second material layer, or there may be one or more other material layers exist between the first material layer and the second material layer. In the case where one or more other material layers exist between the first material layer and the second material layer, the first material layer and the second material layer may not be in direct contact.

Furthermore, it should be understood that, although the terms "first", "second", "third" etc. may be used herein to describe various elements, components, or portions, these elements, components, or portions should not be limited by these terms. These terms are only used to distinguish one element, component, or portion from another element, component, or portion. Thus, a first element, component, or portion discussed below could be termed a second element, component, or portion without departing from the teachings of the present disclosure.

In the disclosure, the thickness, length, and width may be measured by an optical microscope, and the thickness may be measured from a cross-sectional image in a scanning electron microscope, but it is not limited thereto. In addition, a certain error may be provided between any two values or directions used for comparison. The terms "about", "substantially" generally mean within 10% of a given value or range, or mean within 5%, 3%, 2%, 1%, or 0.5% of a given value or range. The value given herein is an approximate value, that is, the meaning of "about" or "substantially" may be implied without a specific description of "about" or "substantially". In addition, the phrase "in a range from a first value to a second value" indicates the range includes the first value, the second value, and other values in between.

In some embodiments of the present disclosure, regarding the words such as "connected", "interconnected", etc. referring to bonding and connection, unless specifically defined, these words mean that two structures are in direct contact or two structures are not in direct contact, and other structures are provided to be disposed between the two structures. The word for joining and connecting may also include the case where both structures are movable or both structures are fixed. In addition, the word "coupled" or "electrically connected" may include any direct or indirect electrical connection means.

Unless defined otherwise, all technical and scientific terms used herein have the same meaning as commonly understood by one of ordinary skill in the art to which this disclosure belongs. It should be appreciated that, in each case, the term, which is defined in a commonly used dictionary, should be interpreted as having a meaning that conforms to the relative skills of the present disclosure and the background or the context of the present disclosure, and should not be interpreted in an idealized or overly formal manner unless so defined.

In accordance with some embodiments of the present disclosure, an electronic device that is provided includes a protective layer with specific properties (for example, Young's modulus). The protective layer with specific properties may effectively block the intrusion of moisture or air from affecting the light-emitting units, or reduce the risk of peeling of the protective layer from the substrate or the light-emitting units being pressed and damaged due to the difference in thermal expansion coefficient of the substrate and the protective layer. In accordance with some embodiments of the present disclosure, the protective layer may further include wavelength conversion particles disposed in the protective layer or reflective structures, which may simplify the manufacturing process (for example, the wavelength conversion layer or the reflective layer may be omitted in the configuration), or improve the color saturation or luminous efficiency of the light-emitting units.

In accordance with some embodiments of the present disclosure, the electronic device may include a display device, a sensing device, or a tiled device, but it is not limited thereto. The electronic device may be a bendable or flexible electronic device. The electronic device may include, for example, liquid-crystal, light-emitting diode, fluorescence, phosphor, or other suitable materials, or a combination thereof, but it is not limited thereto. The tiled device may be, for example, a tiled display device, but it is not limited thereto. The electronic device may be any combination of the foregoing, but it is not limited thereto. It should be understood that the display device will be used as an example to describe the electronic device of the disclosure, but the present disclosure is not limited thereto.

Refer to FIG. 1, which is a cross-sectional diagram of an electronic device 10 in accordance with some embodiments of the present disclosure. It should be understood that, for clear description, some elements of the electronic device 10 are omitted in the figure, and only the backlight module structure of the electronic device 10 is shown. In accordance with some embodiments, additional features may be added to the electronic device 10 described below. In accordance with some other embodiments, some of the features of the electronic device 10 described below may be replaced or omitted.

As shown in FIG. 1, the electronic device 10 may include a driving substrate 102, a plurality of light-emitting units 200, and a protective layer 302. In accordance with some embodiments, the light-emitting units 200 may be disposed on the driving substrate 102 and electrically connected to the driving substrate 102. In accordance with some embodiments, the protective layer 302 may be disposed on the driving substrate 102 and cover the light-emitting units 200.

The light-emitting diode (LED) based on gallium nitride (GaN) is formed by packaging an LED chip, and is often used as the backlight of a display panel. The chip-on-board (COB) package is a packaging type of backlight module design, which bonds the LED chip directly on the substrate.

In accordance with some embodiments, the light-emitting unit 200 may be disposed on the driving substrate 102 in a chip-on-board packaging manner, but it is not limited thereto. In accordance with some embodiments, the driving substrate 102 may be a thin-film transistor (TFT) substrate, that is, the driving substrate 102 may adopt an active matrix driving circuit. However, in accordance with some other embodiments, the driving substrate 102 may also adopt a passive matrix driving circuit. In accordance with some embodiments, the driving substrate 102 may be controlled by an integrated circuit (IC) or a microchip. In accordance with some embodiments, the driving substrate 102 may be a printed circuit board (PCB). Furthermore, the driving substrate 102 may be a flexible substrate or a rigid substrate.

In accordance with some embodiments, the driving substrate 102 may include a substrate and circuit elements (not illustrated) disposed on or in the substrate, such as data lines, scan lines, conductive pads, dielectric layers, or other circuits, etc., but it is not limited thereto. In accordance with some embodiments, the material of the aforementioned substrate may include glass, quartz, sapphire, ceramic, polyimide (PI), polycarbonate (PC), polyethylene terephthalate (PET), rubber, glass fiber, other suitable materials, or a combination thereof, but it is not limited thereto. In accordance with some embodiments, the material of the aforementioned circuit element may include a conductive material. In accordance with some embodiments, the conductive material may include, but is not limited to, a metal conductive material, a transparent conductive material, or a combination thereof. For example, the metal conductive material may include, but is not limited to, copper (Cu), aluminum (Al), tungsten (W), titanium (Ti), gold (Au), platinum (Pt), nickel (Ni), copper alloy, aluminum alloy, tungsten alloy, titanium alloy, gold alloy, platinum alloy, nickel alloy, other suitable conductive materials, or a combination thereof. The transparent conductive material may include transparent conductive oxide (TCO). For example, the transparent conductive oxide may include, but is not limited to, indium tin oxide (ITO), tin oxide (SnO), zinc oxide (ZnO), indium zinc oxide (IZO), indium gallium zinc oxide (IGZO), indium tin zinc oxide (ITZO), antimony tin oxide (ATO), antimony zinc oxide (AZO), other suitable transparent conductive materials, or a combination thereof.

In accordance with some embodiments, the light-emitting units 200 may include light-emitting diodes or LED chips. In accordance with some embodiments, the light-emitting diode may include, for example, organic light-emitting diode (OLED), mini LED, micro LED, or quantum dot (QD) light-emitting diode (for example, QLED or QDLED).

Specifically, as shown in FIG. 1, in accordance with some embodiments, the light-emitting unit 200 may include a semiconductor layer 202. The semiconductor layer 202 may include a p-type semiconductor material, an n-type semiconductor material, and a quantum well structure.

In accordance with some embodiments, the aforementioned n-type semiconductor material may include gallium nitride (n-GaN) or aluminum indium phosphide (n-AlInP) doped with tetravalent atoms, and the aforementioned p-type semiconductor material may include gallium nitride (p-GaN) or aluminum indium phosphide (p-AlInP) doped with divalent atoms, but the present disclosure is not limited thereto. In addition, in accordance with some embodiments, the quantum well structure included in the semiconductor layer 202, for example, may include single quantum well (SQW), multiple quantum well (MQW), other suitable structures, or a combination thereof. In accordance with some embodiments, the material of the semiconductor layer 202 may include, but is not limited to, gallium nitride, aluminum indium phosphide (AlInP), indium gallium nitride (InGaN), other suitable materials, or a combination thereof.

In accordance with some embodiments, the semiconductor layer 202 may be formed by an epitaxial growth process. For example, the semiconductor layer 202 may be formed by a metal organic chemical vapor deposition (MOCVD) process, a molecular beam epitaxy (MBE) process, a hydride vapor phase epitaxy (HVPE) process, a liquid phase epitaxy (LPE) process or other suitable processes, but the present disclosure is not limited thereto.

In addition, as shown in FIG. 1, in accordance with some embodiments, the light-emitting unit 200 may include a first electrode 208 and a second electrode 210. In accordance with some embodiments, the first electrode 208 and the second electrode 210 may serve as the n-electrode and the p-electrode of the light-emitting unit 200, but they are not limited thereto. In accordance with some embodiments, the materials of the first electrode 208 and the second electrode 210 may include conductive materials, for example, may include metal conductive materials, transparent conductive materials, other suitable materials, or a combination thereof, but is it not limited thereto. The types of metal conductive materials and transparent conductive materials of the electrodes are similar to those of the aforementioned circuit elements, and thus will not be repeated herein.

In accordance with some embodiments, the first electrode 208 and the second electrode 210 of the light-emitting unit 200 may be electrically connected to the driving substrate 102 through a first conductive pad 212 and a second conductive pad 214 disposed on the driving substrate 102, respectively. In accordance with some embodiments, the first conductive pad 212 and the second conductive pad 214 may be disposed on a top surface 102$t$ of the driving substrate 102. In accordance with some embodiments, the first conductive pad 212 and the second conductive pad 214 may be electrically connected to data lines, scan lines, or other circuit elements of the driving substrate 102. In accordance with some embodiments, the materials of the first conductive pad 212 and the second conductive pad 214 may include conductive materials, such as metal conductive materials, transparent conductive materials, other suitable materials, or a combination thereof, but they are not limited thereto. The types of metal conductive materials and transparent conductive materials of the conductive pads are similar to those of the aforementioned circuit elements, and thus will not be repeated herein.

In accordance with some embodiments, the first electrode 208, the second electrode 210, the first conductive pad 212, and the second conductive pad 214 may be formed by a chemical vapor deposition (CVD) process, a physical vapor deposition (PVD) process, an electroplating process, an electroless plating process, other suitable processes, or a combination thereof, but the present disclosure is not limited thereto. The chemical vapor deposition process may include a low pressure chemical vapor deposition (LPCVD) process, a low temperature chemical vapor deposition (LTCVD) process, a rapid thermal chemical vapor deposition (RTCVD) process, and a plasma enhanced chemical vapor deposition (PECVD) process, an atomic layer deposition (ALD) process, or other suitable processes. The physical vapor deposition process may include a sputtering process, an evaporation process, a pulsed laser deposition (PLD) process, or other suitable processes.

It should be understood that the figure only schematically illustrates a few light-emitting units 200, but the number and arrangement of the light-emitting units 200 are not limited thereto in accordance with the embodiments of the present disclosure. In addition, it should be understood that although the light-emitting units 200 shown in the drawing are flip-chip type light-emitting diodes, the present disclosure is not limited thereto. In accordance with some embodiments, the light-emitting units 200 may be vertical-chip type light-emitting diodes.

As shown in FIG. 1, In accordance with some embodiments, the protective layer 302 may entirely cover the light-emitting units 200. Furthermore, in accordance with some embodiments, the protective layer 302 may continuously cover the light-emitting units 200. Specifically, in accordance with some embodiments, the protective layer 302 may be in contact with the top surface 102$t$ of the driving substrate 102, and a top surface 302$t$ of the protective layer 302 may be higher than a top surface of the light-emitting unit 200 (for example, the top surface of the semiconductor layer 202).

It should be noted that, in accordance with some embodiments of the present disclosure, the protective layer 302 may have a Young's modulus less than or equal to 20 megapascals (MPa) (i.e., the Young's modulus of the protective layer 302≤20 MPa). In accordance with some embodiments, the Young's modulus of the protective layer 302 may be in a range from 0.02 MPa to 20 MPa (i.e. 0.02 MPa≤the Young's modulus of the protective layer 302≤20 MPa). In addition, in accordance with some embodiments, the Young's modulus of the protective layer 302 may be less than or equal to the Young's modulus of the driving substrate 102, but the present disclosure is not limited thereto.

Furthermore, in accordance with some embodiments, the protective layer 302 may have a thermal expansion coefficient (CTE) less than or equal to 50 (i.e. the thermal expansion coefficient of the protective layer 302≤50). In accordance with some embodiments, the thermal expansion coefficient of the protective layer 302 may be greater than 0 and less than or equal to 50 (i.e. 0<the thermal expansion coefficient of the protective layer 302≤50). In accordance with some embodiments, the thermal expansion coefficient of the protective layer 302 may be substantially the same as the thermal expansion coefficient of the driving substrate 102, but the present disclosure is not limited thereto.

It should be noted that, in accordance with some embodiments, the protective layer 302 with the aforementioned specific properties may effectively protect the light-emitting units 200, reduce external moisture or air intrusion that affects the performance of the light-emitting units 200, or reduce the risk of peeling of the protective layer 302 from the driving substrate 102 (for example, the protective layer 302 and the driving substrate 102 are peeled from the top surface 102$t$) or the light-emitting units 200 being pressed and damaged due to the difference in thermal expansion coefficient of the driving substrate 102 and the protective layer 302.

In addition, in accordance with some embodiments, a viscosity of the protective layer 302 may be less than or equal to 2500 centipoise (cP) (i.e. the viscosity of the protective layer 302≤2500 cP). In accordance with some embodiments, the viscosity of the protective layer 302 may be in a range from 200 cP to 2500 cP (i.e. 200 cP≤the viscosity of the protective layer 302≤2500 cP).

In accordance with some embodiments, the viscosity of the protective layer 302 refers to the viscosity of the protective layer 302 that is measured before curing. In accordance with some embodiments, the Young's modulus and thermal expansion coefficient of the protective layer 302 refer to the Young's modulus and thermal expansion coefficient of the protective layer 302 that are measured after curing. In accordance with some embodiments, the Young's modulus and the coefficient of thermal expansion may be measured by a method known in the art. For example, the Young's modulus may be measured by ASTM (American Society for Testing and Materials) standards such as ASTM D638, and the coefficient of thermal expansion may be measured by ASTM standards such as ASTM D696, but they are not limited thereto.

In accordance with some embodiments, the protective layer 302 may include acrylic resin, such as polymethylmetacrylate (PMMA), epoxy resin, polyurethane (PU), silicone, parylene, polytetrafluoroethylene (PTFE), other suitable materials, or a combination thereof, but it is not limited thereto. In accordance with some embodiments, the protective layer 302 may include a conformal coating.

In accordance with some embodiments, the protective layer 302 may be formed by a chemical vapor deposition process, a coating process, a printing process, other suitable methods, or a combination thereof the foregoing, but the present disclosure is not limited thereto.

In addition, in accordance with some embodiments, the electronic device 10 may further include a plurality of wavelength conversion particles (not illustrated), and the wavelength conversion particles may be mixed in the protective layer 302. In accordance with some embodiments, the wavelength conversion particles may convert the light generated by the light-emitting unit 200 into light of a specific wavelength range (specific color).

In accordance with some embodiments, the wavelength conversion particles may include inorganic materials, including fluorescent, phosphor, quantum dot (QD) materials, or organic light-emitting materials, or other suitable materials, or a combination thereof, but it is not limited thereto. In accordance with some embodiments, the wavelength conversion particles may include phosphors that convert the light generated by the light-emitting unit 200 into red light, green light, blue light, or other suitable color light. Furthermore, in accordance with some embodiments, the quantum dot material may have a core-shell structure. The material of the core structure may include, for example, cadmium selenide (CdSe), cadmium telluride (CdTe), cadmium sulfide (CdS), zinc sulfide (ZnS), zinc selenide (ZnSe), zinc oxide (ZnO), zinc telluride (ZnTe), indium arsenide (InAs), indium phosphide (InP), gallium phosphide (GaP), other suitable materials, or a combination thereof, but it is not limited thereto. The material of the shell structure may include, for example, zinc sulfide (ZnS), zinc selenide (ZnSe), gallium nitride (GaN), gallium phosphide (GaP), other suitable materials, or a combination thereof, but it is not limited thereto.

It should be noted that, in accordance with some embodiments, since the wavelength conversion particles are mixed in the protective layer 302, there is no need to additionally provide a wavelength conversion layer on the light-emitting units 200, thereby may simplify the manufacturing process of the electronic device 10. Furthermore, the wavelength conversion particles mixed in the protective layer 302 may further improve the color saturation or wavelength conversion efficiency of the light-emitting units 200, thereby may enhance the overall optical performance of the electronic device 10.

Next, refer to FIG. 2, which is a cross-sectional diagram of an electronic device 20 in accordance with some other embodiments of the present disclosure. It should be understood that the same or similar components or elements in the following context will be denoted by the same or similar reference numerals, and their materials, manufacturing methods and functions are the same or similar to those described in the previous context, and thus they will not be repeated in the following context.

As shown in FIG. 2, in accordance with some embodiments, the protective layer 302 may include a plurality of separated portions 302s, and the separated portions 302s each cover at least one of the light-emitting units 200. In other words, in accordance with some embodiments, the protective layer 302 may discontinuously cover the light-emitting units 200. In accordance with some embodiments, the top surface 102t of the driving substrate 102 located between the separated portions 302s may be exposed.

Specifically, the separated portions 302s may be spaced apart by a distance d. In accordance with some embodiments, the distance d may be in a range from 20 micrometers ($\mu m$) to 300 $\mu m$ (i.e. 20 $\mu m \leq$ distance d$\leq$300 $\mu m$, or from 30 $\mu m$ to 50 $\mu m$ (i.e. 30 $\mu m \leq$ distance d$\leq$50 $\mu m$), but the present disclosure is not limited thereto. In different embodiments, the distance d may be appropriately adjusted according to the required arrangement of the light-emitting units 200 or the required visual effects.

In accordance with some embodiments, the aforementioned distance d refers to the minimum distance between the separated portions 302s in a direction perpendicular to a normal direction of the driving substrate 102 (for example, the X direction shown in the figure).

In addition, in accordance with the embodiments of the present disclosure, an optical microscopy (OM), a scanning electron microscope (SEM), a film thickness profiler (a-step), an ellipsometer or another suitable method may be used to measure the distance between elements, the height or width of each element. Specifically, in accordance with some embodiments, a scanning electron microscope may be used to obtain any cross-sectional image including the elements to be measured, and the distance between elements, the height or width of each element in the image may be measured.

It should be understood that, although one separated portion 302s may cover (or correspond to) one light-emitting unit 200 in the embodiment shown in FIG. 2, in accordance with some other embodiments, one separated portion 302s may cover (or correspond to) several light-emitting units 200.

Next, refer to FIG. 3, which is a top-view diagram of the electronic device 10 of FIG. 1 in accordance with some embodiments of the present disclosure. It should be understood that the circuit diagram shown in FIG. 3 is used to schematically illustrate the equivalent circuit of the electronic device 10, and does not represent the actual positional relationship of the driving circuit, the light-emitting units 200 and the protective layer 302 in the electronic device 10.

As shown in FIG. 3, in accordance with some embodiments, each light-emitting unit 200 may be independently controlled by a signal line $SL_1$ and a signal line $SL_2$ of the electronic device 10, and the on/off state of each light-emitting unit 200 and the luminous intensity of the light-emitting unit 200 when it is switched on may be adjusted according to actual needs. In accordance with some embodiments, the signal line $SL_1$ and the signal line $SL_2$ may be the scan line and the data line of the driving substrate 102, but they are not limited thereto. As described above, in accordance with some embodiments, the protective layer 302 may continuously cover the light-emitting units 200, that is, the protective layer 302 may be coated on the light-emitting unit 200 over the entire surface of the driving substrate 102.

Figure 4:
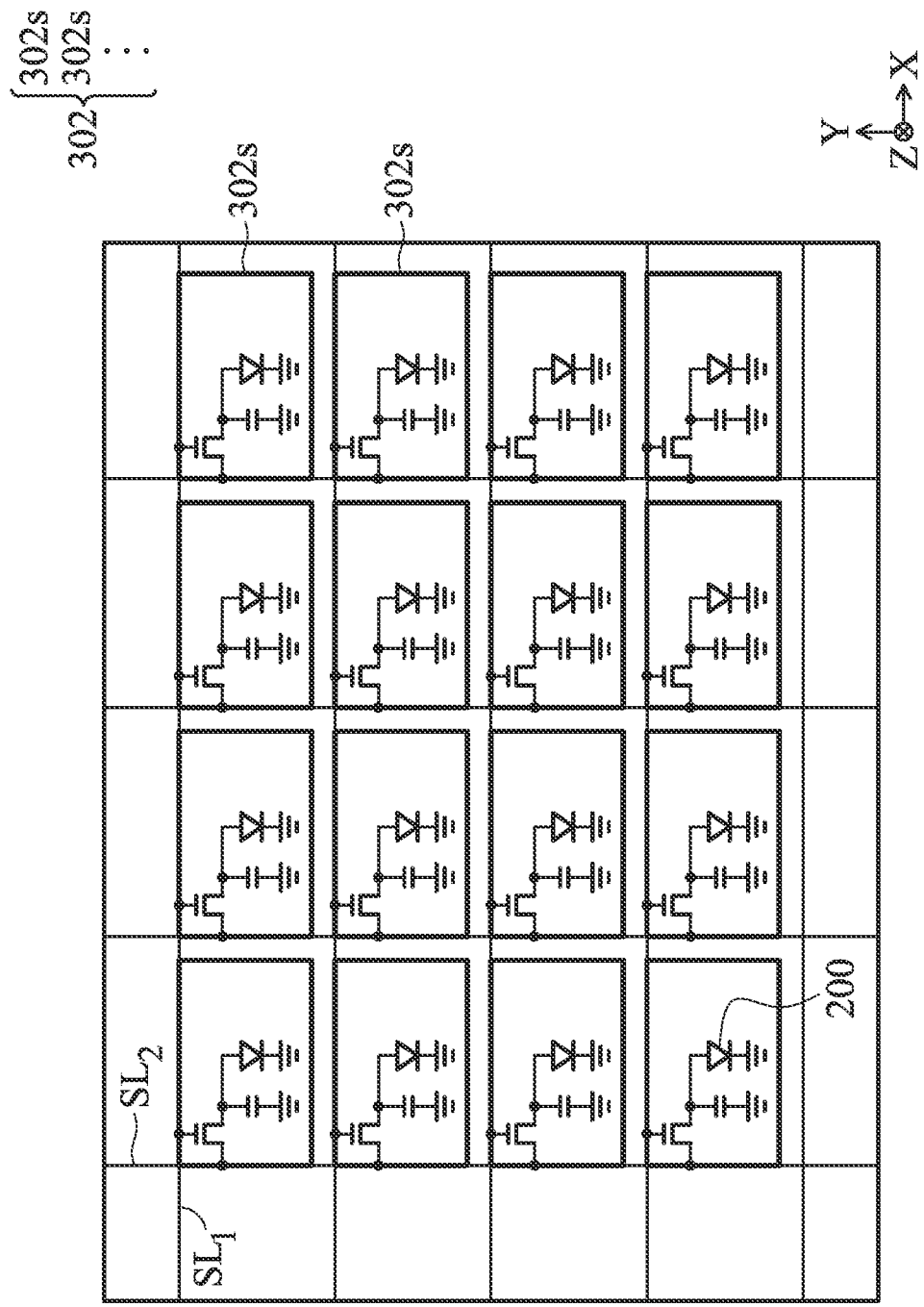

Referring to FIG. 4, in accordance with some other embodiments, the protective layer 302 may include a plurality of separated portions 302s, and the separated portions 302s each cover at least one of the light-emitting units 200. FIG. 4 is a top-view diagram of the electronic device 20 of FIG. 2 in accordance with some embodiments of the present disclosure. It should be understood that the circuit diagram shown in FIG. 4 is used to schematically illustrate the equivalent circuit of the electronic device 20, and does not represent the actual positional relationship of the driving circuit, the light-emitting units 200 and the protective layer 302 in the electronic device 20.

As shown in FIG. 4, in accordance with some embodiments, each light-emitting unit 200 may be independently controlled by the signal line $SL_1$ and the signal line $SL_2$ of the electronic device 20, and the on/off state of each light-emitting unit 200 and the luminous intensity of the light-emitting unit 200 when it is switched on may be adjusted according to actual needs. In accordance with some embodiments, the signal line $SL_1$ and the signal line $SL_2$ may be the scan line and the data line of the driving substrate 102, but they are not limited thereto. As described above, in accordance with some embodiments, the protective layer 302 may discontinuously cover the light-emitting units 200, that is, the separated portions 302s of the protective layer 302 may be separately or regionally coated on the light-emitting units 200.

Figure 5:
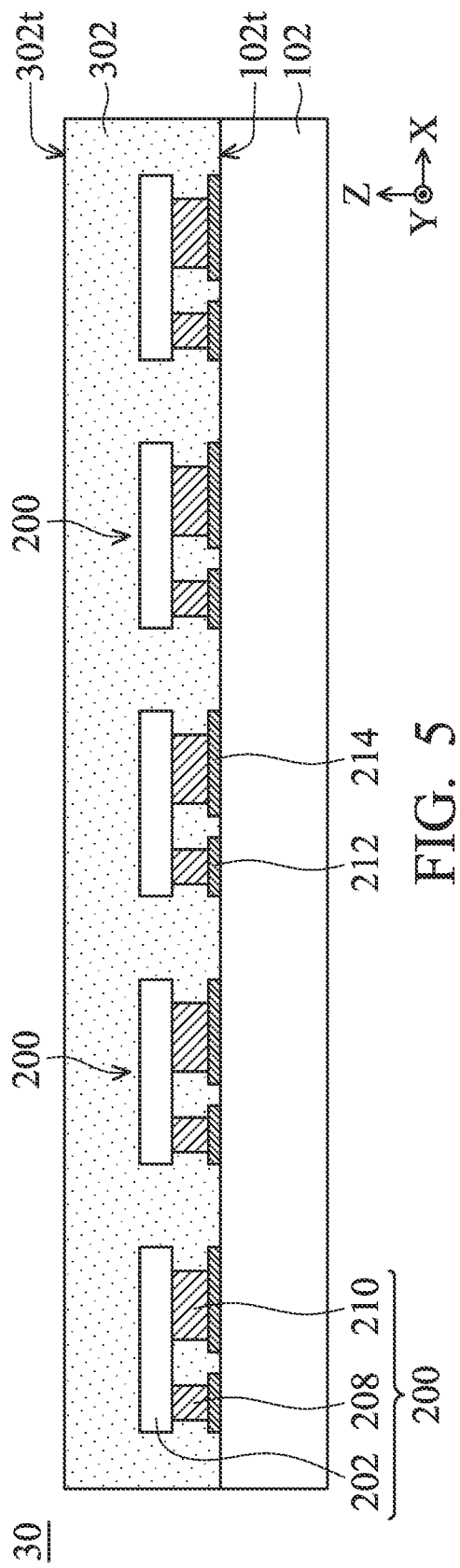
FIGS. 5 to 12 are cross-sectional diagrams of an electronic device in accordance with some embodiments of the present disclosure.

Next, refer to FIG. 5, which is a cross-sectional diagram of an electronic device 30 in accordance with some other embodiments of the present disclosure. As shown in FIG. 5, in accordance with some embodiments, the protective layer 302 may entirely cover the light-emitting units 200. In accordance with some embodiments, the top surface 302t of the protective layer 302 may be at least slightly higher than the top surface of the light-emitting unit 200 (for example, the top surface of the semiconductor layer 202).

Figure 6:
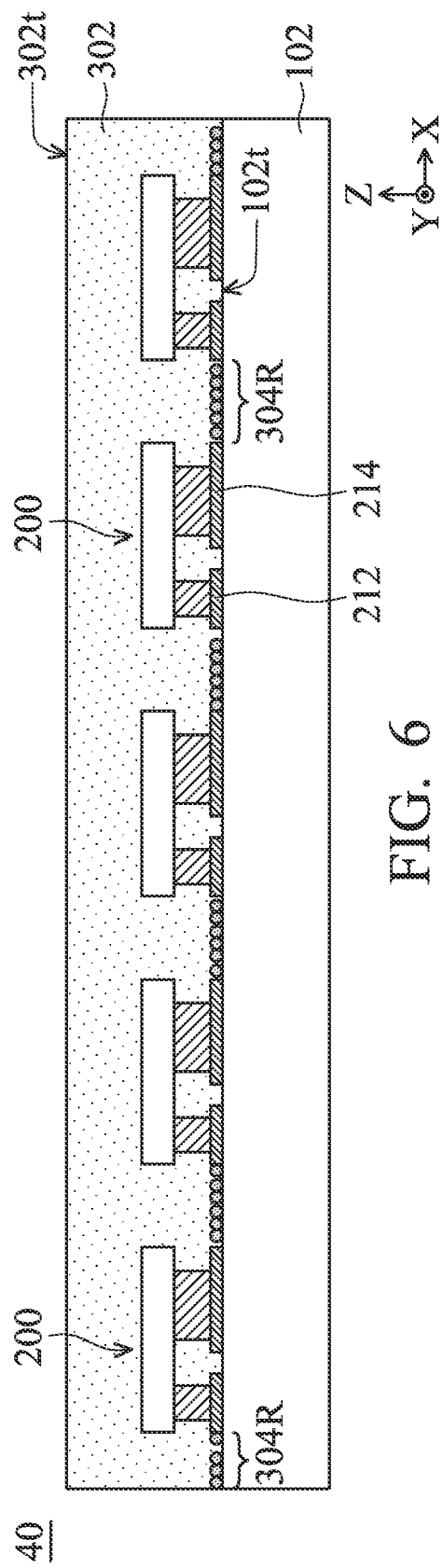

Next, please refer to FIG. 6, which is a cross-sectional diagram of an electronic device 40 in accordance with some other embodiments of the present disclosure. As shown in FIG. 6, in accordance with some embodiments, the electronic device 40 may further include a reflective structure 304R, and the reflective structure 304R may be adjacent to at least one of the light-emitting units 200. In accordance with some embodiments, the reflective structure 304R may be disposed on the top surface 102t of the driving substrate 102 and between adjacent two of the light-emitting units 200, and the protective layer 302 may also cover the reflective structure 304R. In accordance with some embodiments, the reflective structure 304R may reflect the light generated by the light-emitting units 200 and increase the light output rate of the electronic device 40.

In accordance with some embodiments, the reflective structure 304R may have high reflectivity, for example, the reflectivity of the reflective structure 304R may be greater than 90%. In accordance with some embodiments, the reflective structure 304R may include a plurality of reflective particles, reflective coatings, other suitable materials, or a combination thereof. In accordance with some embodiments, the material of the particles with high reflectivity and the coating with high reflectivity may include titanium dioxide ($TiO_2$), zirconium dioxide ($ZrO_2$), niobium-doped titanium oxide (TNO), zinc oxide (ZnO), boron nitride ($BN_3$), other suitable materials, or a combination thereof, but the present disclosure is not limited thereto.

In addition, in accordance with some embodiments, the reflective structure 304R may include a matrix and high-reflectivity particles dispersed in the matrix. In accordance with some embodiments, the material of the aforementioned matrix may include acrylic resin, epoxy resin, polyurethane, silicone, parylene, polytetrafluoroethylene, glass paste, other suitable matrix materials, or a combination thereof, but the present disclosure is not limited thereto. In addition, in accordance with some embodiments, the reflective structure 304R may include a white photoresist.

In accordance with some embodiments, the Young's modulus of the reflective structure 304R may be in a range from 100 MPa to 1000 MPa (i.e. 100 MPa≤Young's modulus of the reflective structure 304R≤1000 MPa). In accordance with some embodiments, the Young's modulus of the reflective structure 304R may be greater than the Young's modulus of the protective layer 302, but the present disclosure is not limited thereto.

In addition, in accordance with some embodiments, the viscosity of the reflective structure 304R may be greater than the viscosity of the protective layer 302. In accordance with some embodiments, the viscosity of the reflective structure 304R refers to the viscosity of the reflective structure 304R that is measured before curing, and the viscosity of the reflective structure 304R may be in a range from 2500 cP to 10000 cP (i.e. 2500 cP≤the viscosity of the reflective structure 304R≤10000 cP).

In accordance with some embodiments, the reflective structure 304R may be formed by a chemical vapor deposition process, a coating process, a printing process, other suitable methods, or a combination thereof, but the present disclosure is not limited thereto.

Figure 7:
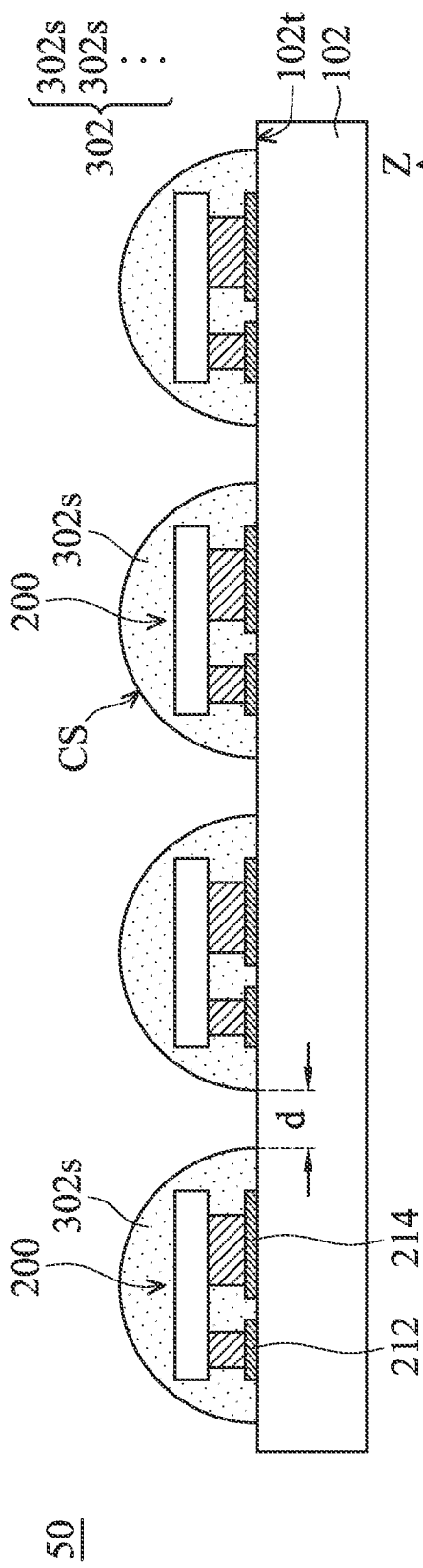

Next, refer to FIG. 7, which is a cross-sectional diagram of an electronic device 50 in accordance with some other embodiments of the present disclosure. As shown in FIG. 7, in accordance with some embodiments, the protective layer 302 of the electronic device 50 may be patterned to form different shapes. For example, in accordance with some embodiments, the separated portion 302s of the protective layer 302 may have an arc-shaped top surface CS. As shown in FIG. 7, in accordance with some embodiments, the separating portion 302s may have a shape similar to a hemisphere. In accordance with some other embodiments, the separated portion 302s of the protective layer 302 may have a square shape, a bell shape, a trapezoid shape, an irregular shape, or any other suitable shape.

In accordance with some embodiments, the shape or profile of the protective layer 302 may be adjusted to make the light-emitting unit 200 have an ideal light-emitting performance, or to adjust the light extraction efficiency of the light-emitting unit 200.

Figure 8:
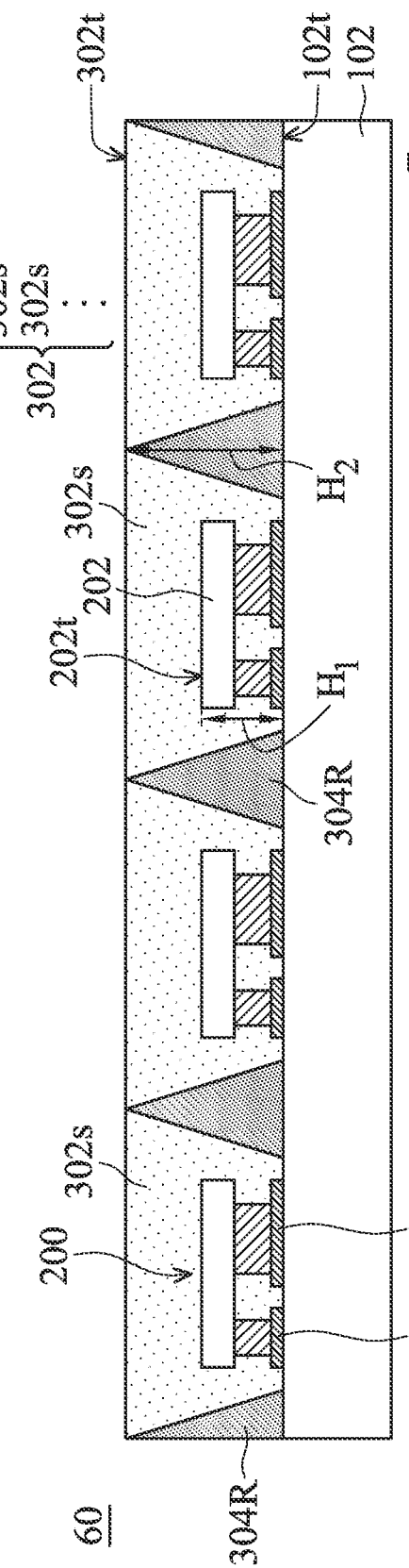

Next, refer to FIG. 8, which is a cross-sectional diagram of an electronic device 60 in accordance with some other embodiments of the present disclosure. As shown in FIG. 8, in accordance with some embodiments, the reflective structure 304R of the electronic device 60 may be patterned to have different configurations. In accordance with some embodiments, the reflective structure 304R may disposed between the light-emitting units 200, and a height $H_2$ of the reflective structure 304R may be greater than a height $H_1$ of the light-emitting unit 200. In other words, in accordance with some embodiments, the light-emitting unit 200 may be disposed in a recess (or an accommodating space) defined by the reflective structure 304R, and the reflective structure 304R may isolate the light-emitting units 200 from each other.

In accordance with some embodiments, the height $H_1$ refers to the maximum height of the light-emitting unit 200 in the normal direction of the driving substrate 102 (for example, the Z direction shown in the figure), for example, the maximum distance between the top surface 202t of the semiconductor layer 202 and the top surface 102t of the driving substrate 102. Furthermore, in accordance with some embodiments, the height $H_2$ refers to the maximum distance between the reflective structure 304R and the top surface 102t of the driving substrate 102 in the normal direction of the driving substrate 102 (for example, the Z direction shown in the figure).

In accordance with some embodiments, the separated portions 302s of the protective layer 302 may be filled in the recesses defined by the reflective structure 304R. In accordance with some embodiments, the top surface 302t of the protective layer 302 may be substantially aligned with the top (not labeled) of the reflective structure 304R. In addition, as shown in FIG. 8, in accordance with some embodiments, the reflective structure 304R may have inclined sidewalls, for example, may have a triangle-like shape in a cross section that is parallel to the normal direction of the driving substrate 102, which may improve the light reflection efficiency, but the present disclosure is not limited thereto. In accordance with some embodiments, the reflective structure 304R may have arc-shaped sidewalls. In accordance with some embodiments of the present disclosure, by providing the reflective structure 304R, the electronic device 60 does not need to provide a reflective sheet, and the assembly or alignment process of the light-emitting units 200 and the reflective sheet may be omitted.

Figure 9:
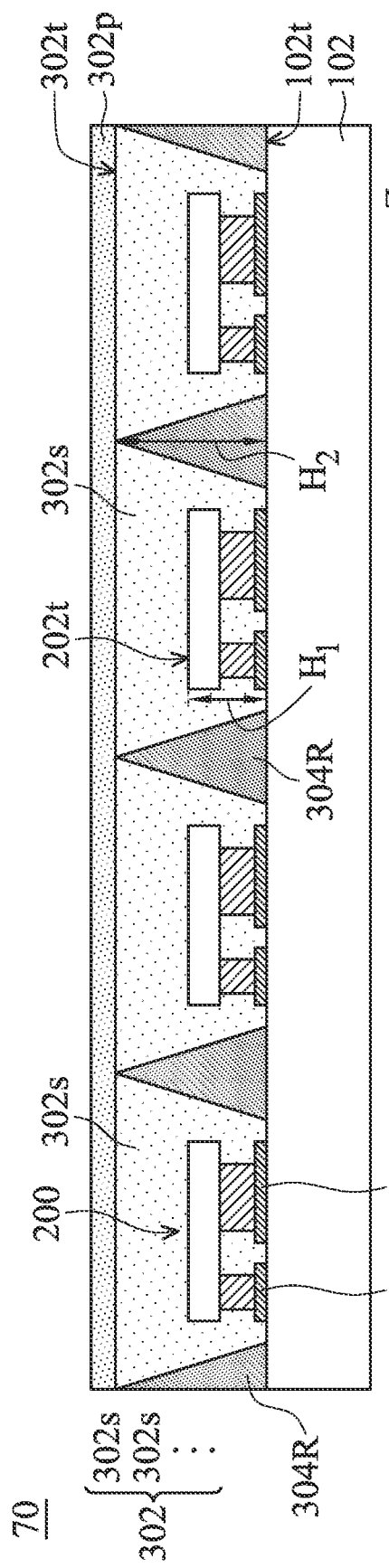

Next, refer to FIG. 9, which is a cross-sectional diagram of an electronic device 70 in accordance with some other embodiments of the present disclosure. As shown in FIG. 9, in accordance with some embodiments, the electronic device 70 may further include a protective layer 302p mixed with wavelength conversion particles, and the protective layer 302p mixed with wavelength conversion particles may be disposed on the protective layer 302. In this embodiment, since the protective layer 302p mixed with wavelength conversion particles is disposed on the protective layer 302, the protective layer 302 does not need to mix the wavelength conversion particles.

In accordance with some embodiments, the protective layer 302p mixed with wavelength conversion particles may be in contact with the top surface 302t of the protective layer 302 and/or the reflective structure 304R. In accordance with some other embodiments, the height of the protective layer 302 may be greater than the height of the reflective structure 304R. Therefore, the protective layer 302p mixed with wavelength conversion particles may contact the top surface 302t of the protective layer 302, but not the reflective structure 304R.

Figure 10:
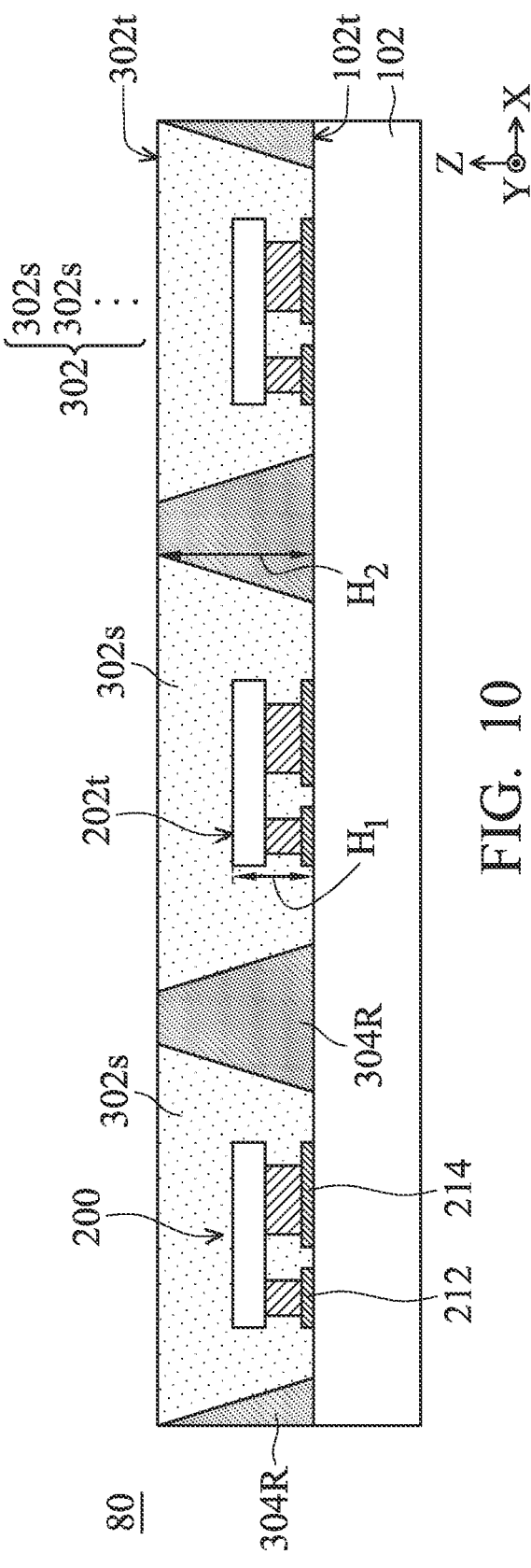

Next, refer to FIG. 10, which is a cross-sectional diagram of an electronic device 80 in accordance with some other embodiments of the present disclosure. As shown in FIG. 10, in accordance with some embodiments, the reflective structure 304R of the electronic device 80 may have a trapezoid-like shape in a cross section that is parallel to the normal direction of the driving substrate 102, which may improve the reflection efficiency of light, but the present disclosure is not limited thereto. In accordance with some embodiments, the reflective structure 304R may have arc-shaped sidewalls. In accordance with some other embodiments, the reflective structure 304R may have any suitable configuration to improve the luminous efficiency of the light-emitting units 200.

Figure 11:
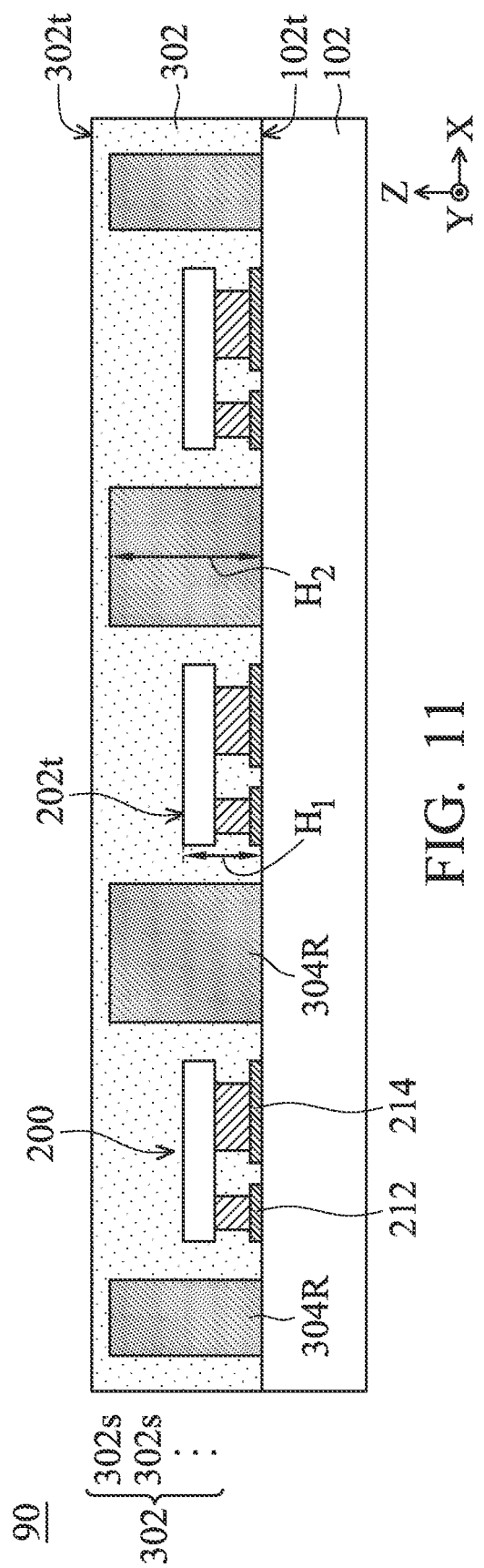

Next, refer to FIG. 11, which is a cross-sectional diagram of an electronic device 90 in accordance with some other embodiments of the present disclosure. As shown in FIG. 11, in accordance with some embodiments, the reflective structure 304R of the electronic device 90 may have a quadrangular shape in a cross section that is parallel to the normal direction of the driving substrate 102, which may improve the reflection efficiency of light, but the present disclosure is not limited thereto. In accordance with some embodiments, the reflective structure 304R may have arc-shaped sidewalls. In addition, in accordance with some embodiments, the top (not labeled) of the reflective structure 304R may not be aligned with the top surface 302t of the protective layer 302. In accordance with some embodiments, the top surface 302t of the protective layer 302 may be higher than the top of the reflective structure 304R.

Figure 12:
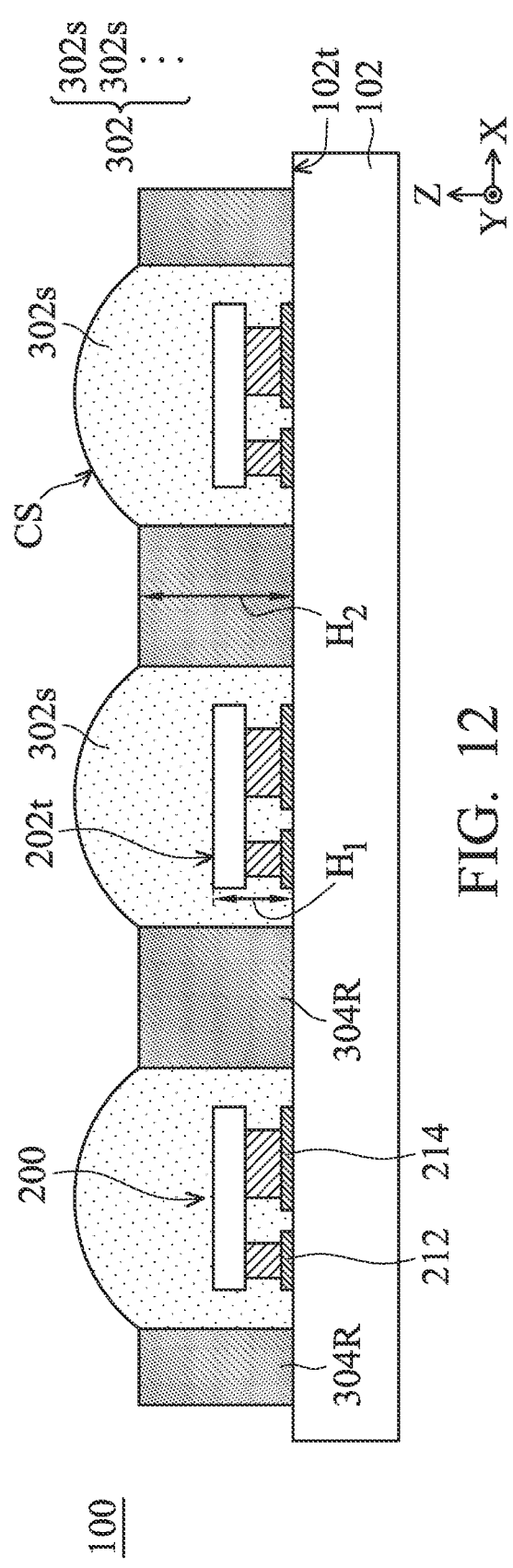

Next, refer to FIG. 12, which is a cross-sectional diagram of an electronic device 100 in accordance with some other embodiments of the present disclosure. As shown in FIG. 12, in accordance with some embodiments, the separated portion 302s of the protective layer 302 of the electronic device 100 may have an arc-shaped top surface CS, and the arc-shaped top surface CS may be connected to the reflective structure 304R. In accordance with some embodiments, the arc-shaped top surface CS of the separation portion 302s may protrude from the top of the reflective structure 304R.

To summarize the above, in accordance with some embodiments of the present disclosure, the electronic device that is provided includes the protective layer with the specific Young's modulus range, which may effectively block the intrusion of moisture or air from affecting the light-emitting units, or reduce the risk of peeling of the protective layer from the driving substrate or the light-emitting units being pressed and damaged due to the difference in thermal expansion coefficient of the substrate and the protective layer. In accordance with some embodiments of the present disclosure, the protective layer may further include wavelength conversion particles disposed in the protective layer or reflective structures, which may simplify the manufacturing process (for example, the wavelength conversion layer or the reflective layer may be omitted in the configuration), or improve the color saturation or luminous efficiency of the light-emitting units and thus improve the overall performance of electronic device.

Although some embodiments of the present disclosure and their advantages have been described in detail, it should be understood that various changes, substitutions and alterations may be made herein without departing from the spirit and scope of the disclosure as defined by the appended claims. The features of the various embodiments may be used in any combination as long as they do not depart from the spirit and scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. The scope of protection of present disclosure is subject to the definition of the scope of the appended claims. Any embodiment or claim of the present disclosure does not have to achieve all the objectives, advantages, and features disclosed in the disclosure.

What is claimed is:

1. An electronic device, comprising:
   a driving substrate;
   a plurality of light-emitting units electrically connected to the driving substrate;
   a protective layer covering the plurality of light-emitting units; and
   a reflective structure adjacent to at least one of the plurality of light-emitting units;
   wherein the protective layer has a Young's modulus less than or equal to 20 MPa, the Young's modulus of the protective layer is less than or equal to a Young's modulus of the driving substrate, and the protective layer has a thermal expansion coefficient (CTE) greater than 0 and less than or equal to 50,
   wherein the reflective structure comprises a plurality of particles disposed on a top surface of the driving substrate, and a viscosity of the reflective structure is greater than a viscosity of the protective layer.

2. The electronic device as claimed in claim 1, wherein the protective layer entirely covers the plurality of light-emitting units.

3. The electronic device as claimed in claim 1, wherein the protective layer partially covers the plurality of light-emitting units.

4. The electronic device as claimed in claim 1, wherein the protective layer comprises acrylic resin, epoxy resin, polyurethane, silicone, parylene, polytetrafluoroethylene, or a combination thereof.

5. The electronic device as claimed in claim 1, wherein the protective layer continuously covers the plurality of light-emitting units.

6. The electronic device as claimed in claim 1, further comprising a plurality of wavelength conversion particles mixed in the protective layer.

7. The electronic device as claimed in claim 1, wherein the reflective structure is disposed on the driving substrate and between adjacent two of the plurality of light-emitting units.

8. The electronic device as claimed in claim 1, wherein the protective layer covers the reflective structure.

9. The electronic device as claimed in claim 1, wherein a Young's modulus of the reflective structure is greater than the Young's modulus of the protective layer.

10. The electronic device as claimed in claim 1, wherein the reflective structure has inclined sidewalls or arc-shaped sidewalls.

11. The electronic device as claimed in claim 1, wherein the driving substrate is a thin-film transistor substrate.

12. The electronic device as claimed in claim 1, wherein the driving substrate is a printed circuit board.

13. The electronic device as claimed in claim 1, wherein the Young's modulus of the protective layer is in a range from 0.02 MPa to 20 MPa.

14. The electronic device as claimed in claim 1, wherein the viscosity of the protective layer is in a range from 200 cP to 2500 cP.

* * * * *